(12) United States Patent
Matsushita

(10) Patent No.: US 10,914,788 B2
(45) Date of Patent: Feb. 9, 2021

(54) BATTERY SYSTEM, REMAINING CAPACITY ESTIMATION DEVICE, AND REMAINING CAPACITY ESTIMATION METHOD

(71) Applicants: KABUSHIKI KAISHA TOSHIBA, Minato-ku (JP); TOSHIBA INFRASTRUCTURE SYSTEMS & SOLUTIONS CORPORATION, Kawasaki (JP)

(72) Inventor: Hiroki Matsushita, Kawasaki (JP)

(73) Assignees: KABUSHIKI KAISHA TOSHIBA, Minato-ku (JP); TOSHIBA INFRASTRUCTURE SYSTEMS & SOLUTIONS CORPORATION, Kawasaki (JP)

( * ) Notice: Subject to any disclaimer, the term of this patent is extended or adjusted under 35 U.S.C. 154(b) by 46 days.

(21) Appl. No.: 16/274,338

(22) Filed: Feb. 13, 2019

(65) Prior Publication Data

US 2019/0265306 A1 Aug. 29, 2019

(30) Foreign Application Priority Data

Feb. 28, 2018 (JP) ................. 2018-034376

(51) Int. Cl.
*G01R 31/3842* (2019.01)
*G01R 31/36* (2020.01)
*G01R 31/367* (2019.01)
*H01M 10/48* (2006.01)
*G01R 31/3828* (2019.01)

(52) U.S. Cl.
CPC ....... *G01R 31/3842* (2019.01); *G01R 31/367* (2019.01); *G01R 31/3646* (2019.01); *G01R 31/3828* (2019.01); *H01M 10/482* (2013.01)

(58) Field of Classification Search
CPC ............ G01R 31/3842; G01R 31/3828; G01R 31/3646; G01R 31/367
See application file for complete search history.

(56) References Cited

U.S. PATENT DOCUMENTS 5,751,137 A * 5/1998 Kiuchi .................... B60L 58/15
322/14
6,469,471 B1 10/2002 Anbuky et al.
(Continued)

FOREIGN PATENT DOCUMENTS

| JP | 2003-168489 | 6/2003 |
| JP | 2008-199723 | 8/2008 |
| JP | 2013-250071 | 12/2013 |

*Primary Examiner* — Dominic E Hawkins
(74) *Attorney, Agent, or Firm* — Oblon, McClelland, Maier & Neustadt, L.L.P.

(57) ABSTRACT

Certain embodiments provide battery system including: a battery; a current measurement unit configured to measure a current charged to or discharged from the battery; a voltage measurement unit configured to measure an output voltage of the battery; a function creation unit configured to create a function representing a depth-of-discharge characteristic of the battery on the basis of the measured current and output voltage; and a remaining capacity calculation unit configured to calculate a remaining capacity corresponding to the output voltage of the battery using the created function.

9 Claims, 14 Drawing Sheets

(56) References Cited

U.S. PATENT DOCUMENTS

| | | | |
|---|---|---|---|
| 6,624,635 B1* | 9/2003 | Lui | H02J 7/0022 |
| | | | 324/426 |
| 9,846,197 B2* | 12/2017 | Nagato | G01R 31/3835 |
| 2004/0128089 A1 | 7/2004 | Barsoukov et al. | |
| 2010/0138178 A1* | 6/2010 | Paryani | G01R 31/3842 |
| | | | 702/63 |
| 2014/0021959 A1 | 1/2014 | Maluf et al. | |
| 2014/0277248 A1* | 9/2014 | Younker | A61M 5/14276 |
| | | | 607/36 |
| 2017/0269165 A1 | 9/2017 | Takashima et al. | |
| 2018/0128880 A1* | 5/2018 | Miyamoto | H02J 7/0047 |

* cited by examiner

FIG. 4

| OUTPUT VOLTAGE (V) | Δ IT(Ah) | | | |
|---|---|---|---|---|
| | AT THE TIME OF SHIPMENT | FIRST | SECOND | .... |
| 28.4-28.5 |  | — — | — — | — — |
| 28.3-28.4 |  |  | — — | — — |
| 28.2-28.3 |  |  | — — | — — |
| .... |  |  | — — | — — |
| 27.6-27.7 |  |  | — — | — — |
| 27.5-27.6 |  |  |  |  |
| 27.4-27.5 |  |  |  |  |
| .... |  |  |  |  |
| 26.9-27.0 |  |  | — — |  |
| 26.8-26.9 |  | — — | — — |  |
| 26.7-26.8 |  | — — | — — | — — |
| .... |  | — — | — — |  |
| 26.1-26.2 |  | — — | — — | — — |
| 26.0-26.1 |  | — — | — — | — — |

FIG. 5

| OUTPUT VOLTAGE (V) | LATEST Δ IT (Ah) | DEPTH OF DISCHARGE (Ah) ||
|---|---|---|---|
| | | AT THE TIME OF SHIPMENT | AT THE TIME OF UPDATING |
| 28.5 | 0.2 | 0.0 | 0.0 |
| 28.4 | 0.3 | 0.2 | 0.2 |
| 28.3 | 0.3 | 0.3 | 0.5 |
| .... | .... | .... | .... |
| 27.7 | .... | .... | .... |
| 27.6 | 1.0 | 9.5 | 3.5 |
| 27.5 | 1.2 | 11.8 | 4.5 |
| .... | .... | .... | .... |
| 27.0 | 1.5 | 21.5 | 10.8 |
| 26.9 | 2.2 | 22.2 | 12.3 |
| 26.8 | — — | 22.5 | 14.5 |
| 26.7 | — — | — — | — — |
| .... | — — | — — | — — |
| 26.1 | — — | — — | — — |
| 26.0 | — — | — — | — — |

BATTERY SYSTEM, REMAINING CAPACITY ESTIMATION DEVICE, AND REMAINING CAPACITY ESTIMATION METHOD

CROSS-REFERENCE TO RELATED APPLICATIONS

This application is based upon and claims the benefit of priority from the prior Japanese Patent Application No. 2018-034376 filed in Japan on Feb. 28, 2018; the entire contents of which are incorporated herein by reference.

FIELD

Embodiments described herein relate generally to a battery system, a remaining capacity estimation device, and a remaining capacity estimation method.

BACKGROUND

A battery is used to continuously supply electric energy to an electric device. If there is no electric energy remaining in the battery while using the electric device, the electric device may be failed. For this reason, it is necessary to charge or replace the battery before no electric energy remains in the battery.

As a technique of estimating the remaining capacity of the battery, there is known a technique of estimating the remaining capacity of the battery on the basis of a depth-of-discharge characteristic curve of the battery measured at the time of manufacturing and an output voltage of the battery. The depth-of-discharge characteristic curve is a characteristic curve simulating a relationship between the current amount remaining in the battery and the battery output voltage.

However, the battery depth-of-discharge characteristic changes from its initial characteristic as the battery is subjected to temporal degradation. Therefore, estimation accuracy of the remaining capacity of the battery is degraded disadvantageously as the battery is subjected to temporal degradation. The depth-of-discharge characteristic curve may be updated by periodically measuring the depth-of-discharge characteristic of the battery. However, for this purpose, it is necessary to prepare a measurement device for measuring the depth-of-discharge characteristic. In addition, since it is necessary to remove the battery from the equipment during the measurement of the depth-of-discharge characteristic for updating, it is necessary to stop operation of the equipment disadvantageously.

BRIEF DESCRIPTION OF THE DRAWINGS

FIG. 4 is a diagram for describing the function creation unit according to the first embodiment of the invention;

FIG. 5 is a diagram for describing the function creation unit according to the first embodiment of the invention;

DETAILED DESCRIPTION

Certain embodiments provide a battery system including: a battery; a current measurement unit configured to measure a current charged to or discharged from the battery; a voltage measurement unit configured to measure an output voltage of the battery; a function creation unit configured to create a function representing a depth-of-discharge characteristic of the battery on the basis of the measured current and the output voltage; and a remaining capacity calculation unit configured to calculate a remaining capacity corresponding to the output voltage of the battery using the created function.

First Embodiment

Figure 1:
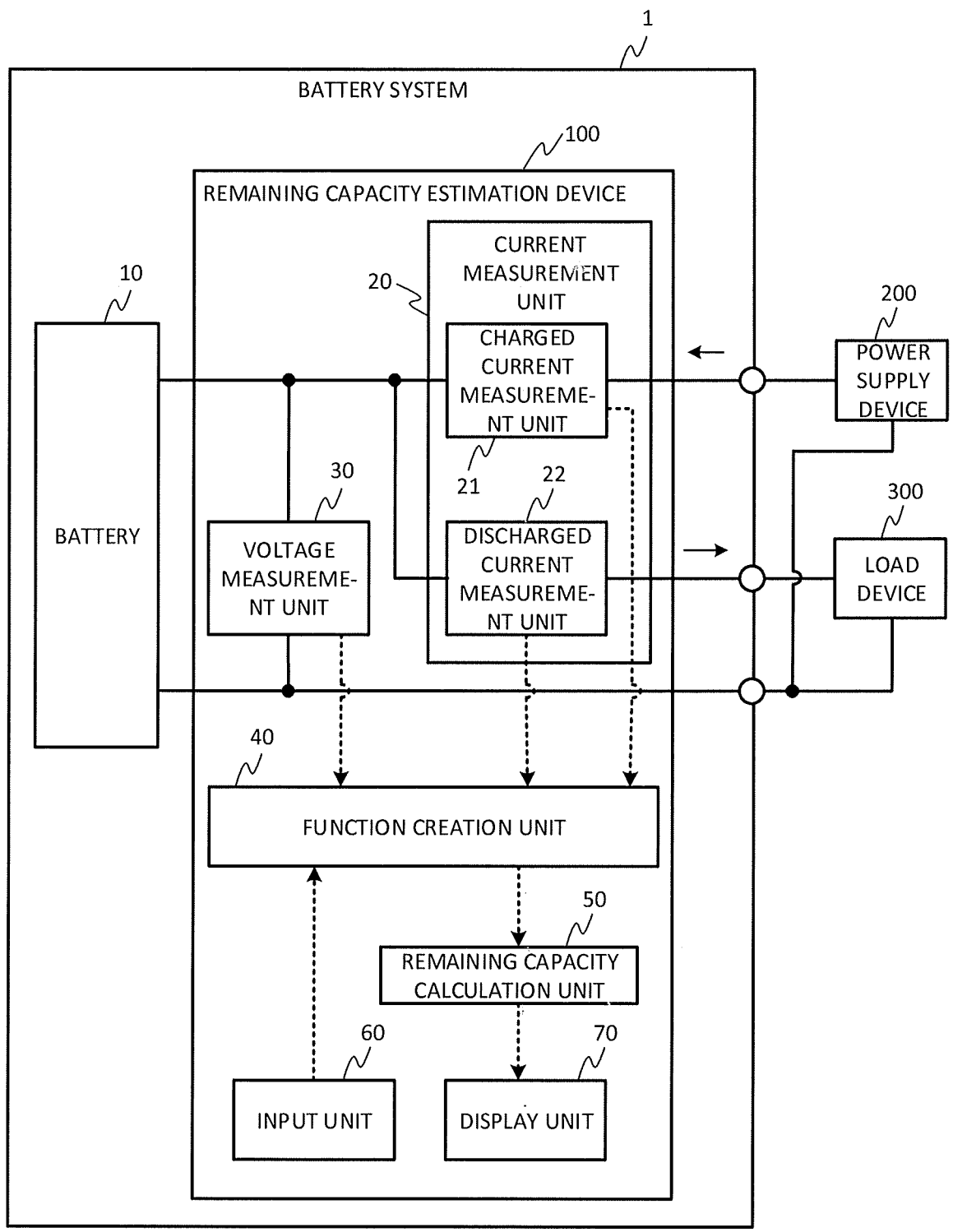
FIG. 1 is a block diagram illustrating a battery system according to a first embodiment of the invention.

A battery system according to this embodiment is employed in a vehicle, a ship, an airplane, a home appliance, and the like. A first embodiment of the invention will now be described with reference to the accompanying drawings. FIG. 1 is a block diagram illustrating a battery system 1 according to a first embodiment of the invention. The battery system 1 supplies power to a load device 300. The load device 300 includes an electric device that consumes electric power, such as an electric motor, an air conditioner, and a lighting device. As the power is supplied to the load device 300, a remaining capacity of the current stored in the battery 10 of the battery system 1 decreases. The battery 10 of the battery system 1 can be charged from a power supply device 200. In FIG. 1, a line relating to a charge/discharge operation is indicated by a solid line, and a signal line is indicated by a dotted line.

As illustrated in FIG. 1, the battery system 1 has a battery 10 and a remaining capacity estimation device 100.

The battery 10 includes a lithium ion battery, a lead storage battery, or the like. The battery 10 is configured to output a predetermined voltage and accumulate a predetermined current amount by combining a plurality of battery cells in series or in parallel.

As illustrated in FIG. 1, the remaining capacity estimation device 100 has a current measurement unit 20, a voltage measurement unit 30, a function creation unit 40, a remaining capacity calculation unit 50, an input unit 60, and a display unit 70.

The current measurement unit 20 has a charged current measurement unit 21 that measures a current charged to the battery 10 from the power supply device 200, and a discharged current measurement unit 22 that measures a current discharged to the load device 300 from the battery 10. The charged current measurement unit 21 and the discharged current measurement unit 22 have a DC current meter and an analog/digital converter. In addition, the charged current measurement unit 21 and the discharged current measurement unit 22 convert the measured current into digital data and supply the digital data to the function creation unit 40.

The voltage measurement unit 30 measures an output voltage of the battery 10. The voltage measurement unit 30 has a DC voltage meter and an analog/digital converter. In addition, the voltage measurement unit 30 converts the measured voltage into digital data and supplies the digital data to the function creation unit 40.

Figure 2:
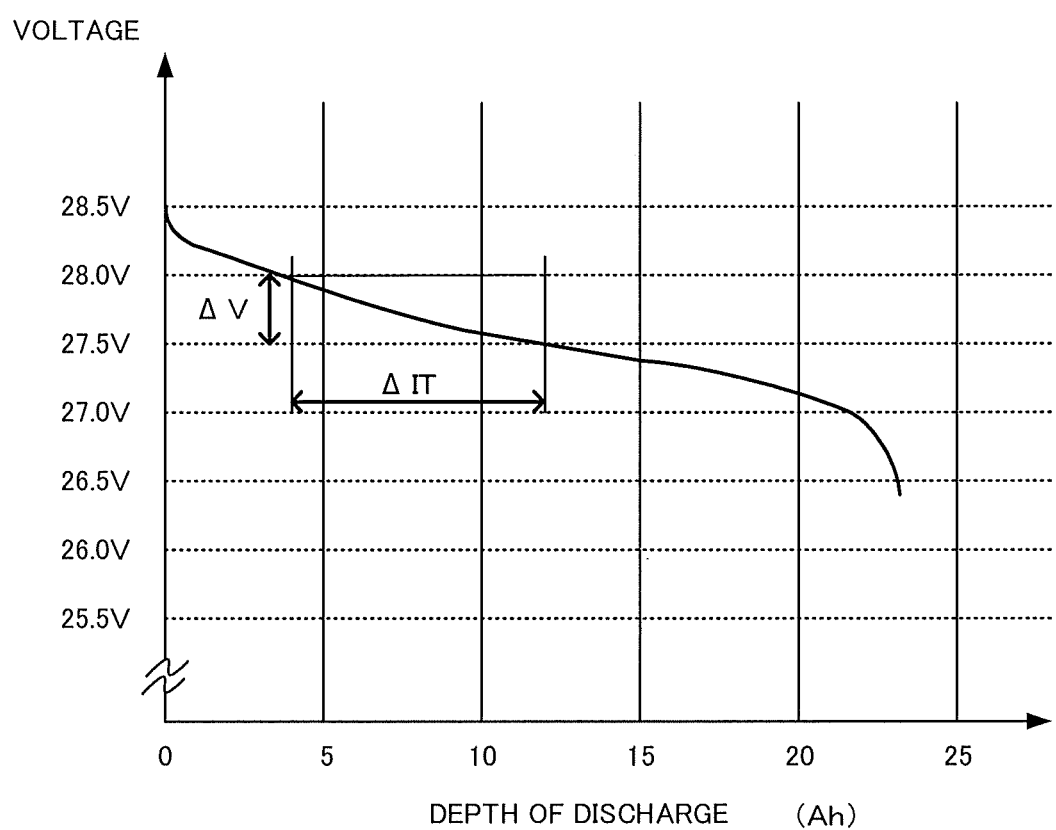
FIG. 2 is a diagram for describing a battery depth-of-discharge characteristic.

The function creation unit 40 creates a function representing a depth-of-discharge characteristic of the battery 10 on the basis of the measured current and the output voltage. The depth-of-discharge characteristic is also referred to as a depth of discharge (DOD) characteristic. FIG. 2 illustrates an exemplary function (graph) representing the depth-of-discharge characteristic. The abscissa refers to a depth of discharge (DOD). A depth of discharge when the battery 10 is fully charged is set to zero (0). The depth of discharge on the abscissa indicates a current amount discharged from the battery 10. The ordinate refers to an output voltage of the battery 10 corresponding to the depth of discharge. The value "$\Delta IT$" denotes a variation of the depth of discharge caused by a charge/discharge operation of the battery 10. The value "$\Delta V$" denotes a variation of the output voltage. As illustrated in FIG. 2, as the battery 10 is discharged, the depth of discharge increases, and the output voltage of the battery 10 decreases.

Figure 3:
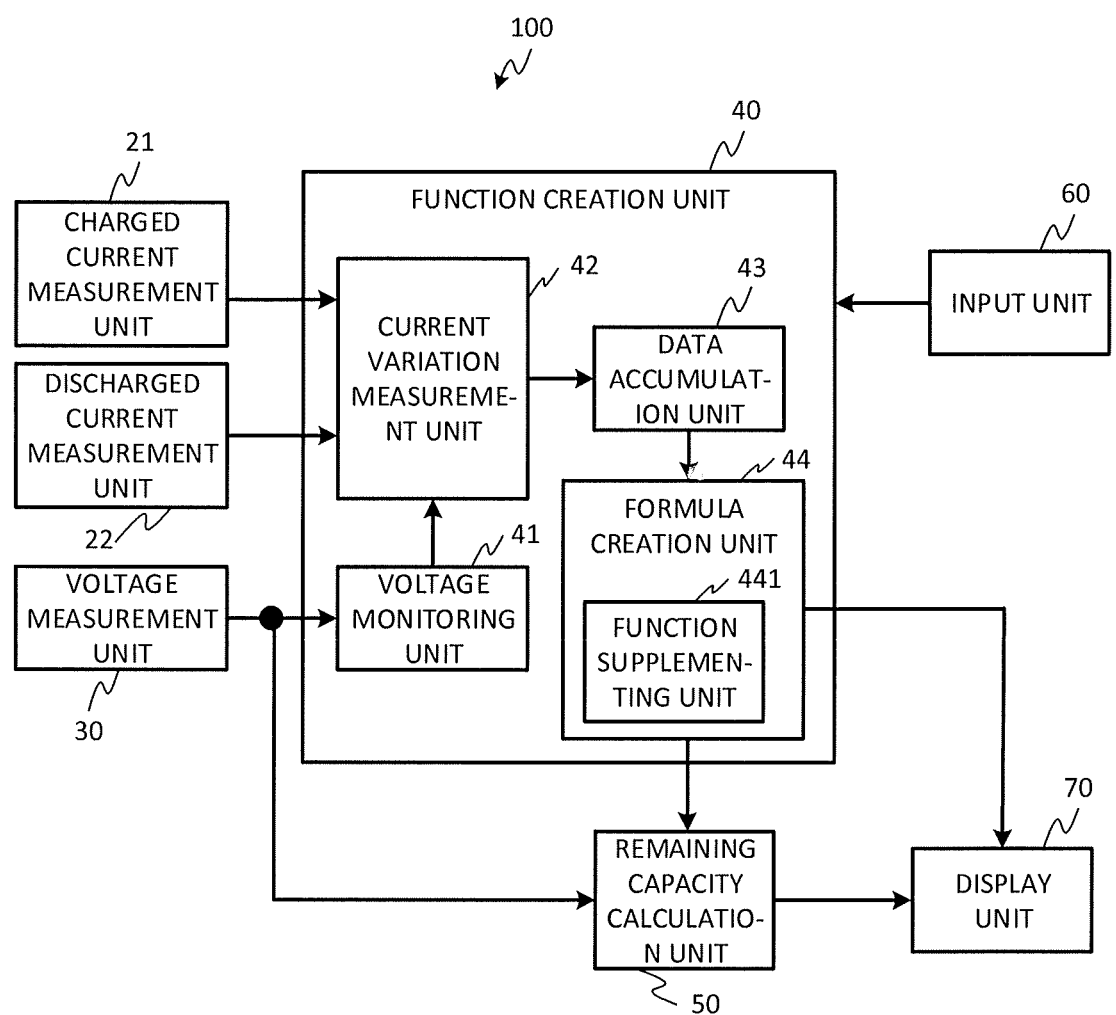
FIG. 3 is a block diagram illustrating a function creation unit according to the first embodiment of the invention.

As illustrated in FIG. 3, the function creation unit 40 has a voltage monitoring unit 41, a current variation measurement unit 42, a data accumulation unit 43, and a formula creation unit 44 in order to create a function representing the depth-of-discharge characteristic.

The voltage monitoring unit 41 monitors a voltage notified from the voltage measurement unit 30. In addition, the voltage monitoring unit 41 transmits a trigger signal and a value of the measured output voltage to the current variation measurement unit 42 whenever the output voltage of the battery 10 changes by $\Delta V$. In the following description, it is assumed that "$\Delta V=0.1$ V".

The current variation measurement unit 42 calculates the depth of discharge of the battery 10 on the basis of the current charged to or discharged from the battery 10 and the output voltage of the battery 10. Specifically, the current variation measurement unit 42 has a functionality of current integration, and measures a current amount charged to or discharged from the battery 10 in response to the trigger signal notified from the voltage monitoring unit 41 until the next trigger signal is received. Specifically, the current variation measurement unit 42 calculates a total sum of the current measured by the charged current measurement unit 21 or the discharged current measurement unit 22 while the output voltage changes by 0.1 V in response to the trigger signal until the next trigger signal is received. This total sum of the current indicates the depth-of-discharge variation. The current variation measurement unit 42 transmits data by associating the calculated depth-of-discharge variation $\Delta IT$ and the output voltage of the battery 10 received from the voltage monitoring unit 41 to the data accumulation unit 43. Note that, since the depth-of-discharge variation $\Delta IT$ measured in response to the trigger signal until the next trigger signal is received is a depth-of-discharge variation per unit voltage (0.1 V), this corresponds to a slope of the depth-of-discharge characteristic curve of FIG. 2.

The data accumulation unit 43 accumulates the data obtained by associating the output voltage and the depth-of-discharge variation transmitted from the current variation measurement unit 42 in a table of FIG. 4. The depth-of-discharge variation $\Delta IT$ per $\Delta V$ (=0.1 V) of the depth-of-discharge characteristic curve at the time of shipment is stored in a column "AT THE TIME OF SHIPMENT" of FIG. 4.

As a discharge operation starts from a full charge state, the voltage monitoring unit 41 detects a change of the output voltage of the battery 10 through a voltage range of 28.3 V to 28.4 V, and transmits the measured output voltage and the trigger signal to the current variation measurement unit 42. The current variation measurement unit 42 transmits, to the data accumulation unit 43, the depth-of-discharge variation $\Delta IT$ as a total sum of the current measured by the charged current measurement unit 21 or the discharged current measurement unit 22 and the received output voltage in response to the previous trigger signal until the next trigger signal is received. The data accumulation unit 43 stores the received data of the depth-of-discharge variation in the "FIRST" column of the row "28.3 V to 28.4 V" of FIG. 4. As the discharge operation from the battery 10 to the load device 300 is performed, the output voltage of the battery 10 decreases. As the voltage monitoring unit 41 detects that the output voltage of the battery 10 changes through the voltage range of "28.2 V to 28.3 V", the data accumulation unit 43 stores the data of the depth-of-discharge variation received at this time in the "FIRST" column of the "28.2 V to 28.3 V" row of FIG. 4. Similarly, the data accumulation unit 43 stores the data of the depth-of-discharge variation corresponding to a change of the output voltage.

The output voltage of the battery 10 passes through the same voltage range (for example, a voltage range of 27.4 V to 27.5 V) in the next time when the battery 10 is charged. The data accumulation unit 43 stores the data of the depth-of-discharge variation received at this time in the "SECOND" column of the corresponding row. As illustrated in FIG. 4, the data accumulation unit 43 stores the depth-of-discharge variation for a period of the output voltage change ($\Delta V=0.1$ V) whenever the output voltage of the battery 10 changes by $\Delta V$ (=0.1 V). As illustrated in FIG. 4, the data accumulation unit 43 stores the depth-of-discharge variation in the "SECOND" and "THIRD" columns of a new row whenever the charge/discharge operation of the battery 10 is repeated.

The current variation measurement unit 42 creates a table indicating the depth of discharge corresponding to the output voltage of the battery 10 by sequentially integrating the values of the "LATEST $\Delta IT$" column of FIG. 5. Specifically, the current variation measurement unit 42 creates the table including the "AT THE TIME OF UPDATING" column of the right end column "DEPTH OF DISCHARGE" of FIG. 5 by sequentially adding the values of the "LATEST $\Delta IT$" column with respect to an output voltage of 28.5 V and a shipment depth of discharge at the time of shipment of 0 Ah, and stores the table in the data accumulation unit 43.

The embodiment will be described with reference to FIG. 5. The depth of discharge at the time of shipment corresponding to an output voltage of 28.5 V is "0 Ah". The depth of discharge at the time of updating corresponding to an output voltage of 28.4 V becomes "0.2 Ah" by adding the shipment depth of discharge of 0 Ah and the latest $\Delta IT$ (=0.2 Ah) of the output voltage of 28.5 V. The depth of discharge at the time of updating corresponding to an output voltage of 28.3 V becomes "0.5 Ah" by adding the latest $\Delta IT$ (=0.3 Ah) corresponding to the output voltage of 28.4 V to the depth of discharge (=0.2 Ah) at the time of updating corresponding to the output voltage of 28.4 V. Similarly, the current variation measurement unit 42 creates the table including the "AT THE TIME OF UPDATING" column of the right end column "DEPTH OF DISCHARGE" of FIG. 5.

Figure 6:
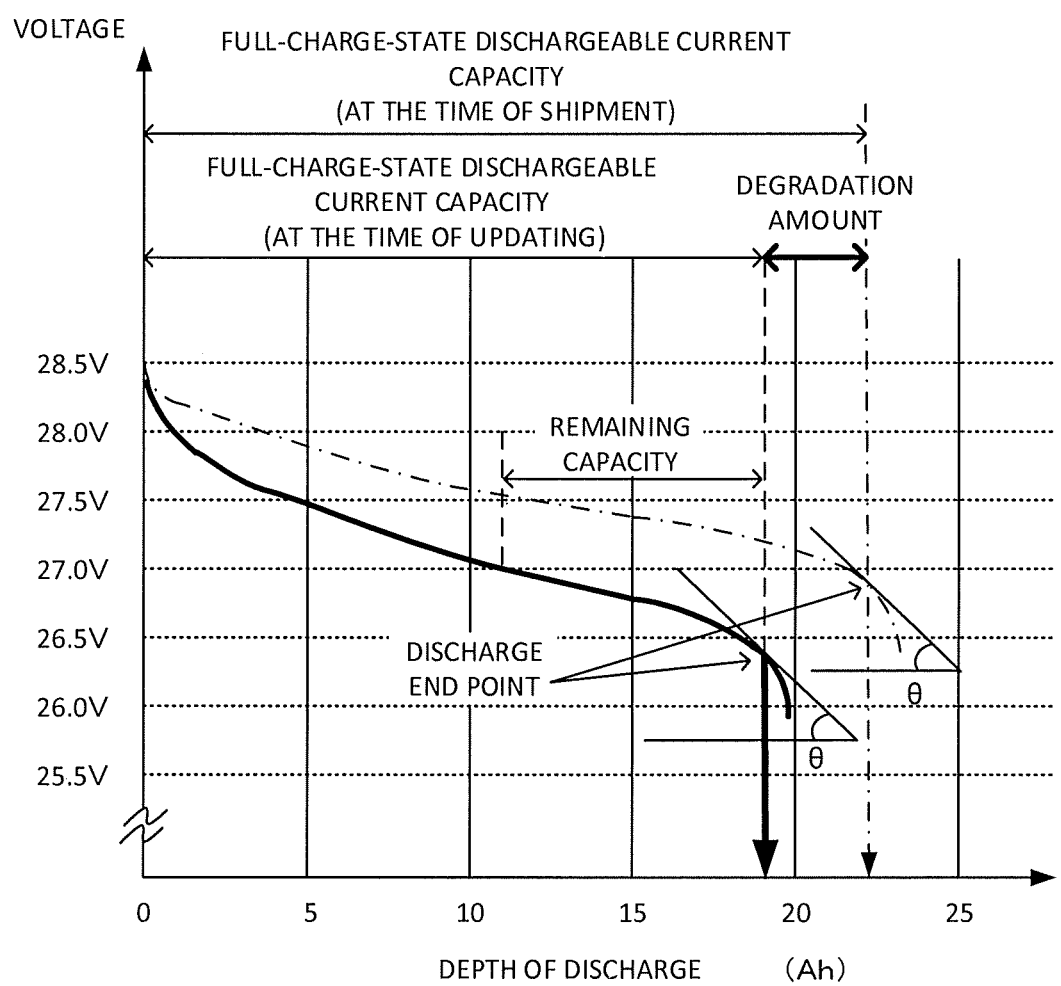
FIG. 6 is a diagram for describing a battery depth-of-discharge characteristic.

The formula creation unit 44 creates the latest depth-of-discharge characteristic curve on the basis of the table of the depth of discharge at the time of updating shown in the right end column of FIG. 5. An exemplary latest depth-of-discharge characteristic curve at the time of arbitrary measurement created by the formula creation unit 44 is indicated by a solid line in FIG. 6. The depth-of-discharge characteristic curve at the time of shipment is indicated by a one-dotted chain line. As illustrated in FIG. 6, the depth-of-discharge characteristic at the time of shipment changes depending on temporal degradation of the battery 10.

Meanwhile, if the remaining capacity of the battery 10 is small, the output voltage of the battery 10 starts to abruptly decrease. That is, the slope $\theta$ obtained by differentiating the function of FIG. 6 abruptly increases. A point at which this slope $\theta$ becomes equal to or larger than a predetermined angle will be referred to as a "discharge end point". The depth-of-discharge variation until the depth of discharge corresponding to the output voltage at the time of measurement reaches the discharge end point is the "remaining capacity". A full-charge-state dischargeable current capacity refers to a current amount that can be discharged until the depth of discharge reaches the discharge end point from the full charge state of the battery 10. That is, the full-charge-state dischargeable current amount is selected as an index indicating a current amount dischargeable from the full charge state of the battery 10. As illustrated in FIG. 6, the full-charge-state dischargeable current amount tends to decrease as the battery 10 is subjected to temporal degradation.

The formula creation unit 44 obtains the discharge end point on the basis of a preset slope $\theta$ using a function for approximating the created depth-of-discharge characteristic curve. For example, in the example of FIG. 6, the formula creation unit 44 calculates the discharge end point as (18 Ah, 26.4 V).

The formula creation unit 44 has a functionality of determining whether or not the updated full-charge-state dischargeable current amount indicated by the function of the depth-of-discharge characteristic of the battery 10 is equal to or smaller than a preset threshold value. For example, in a case where the threshold value is set to "20 Ah", and the full-charge-state dischargeable current capacity becomes equal to or smaller than "20 Ah", the formula creation unit 44 causes the display unit 70 to display an alarm for urging replacement of the battery 10.

Figure 7:
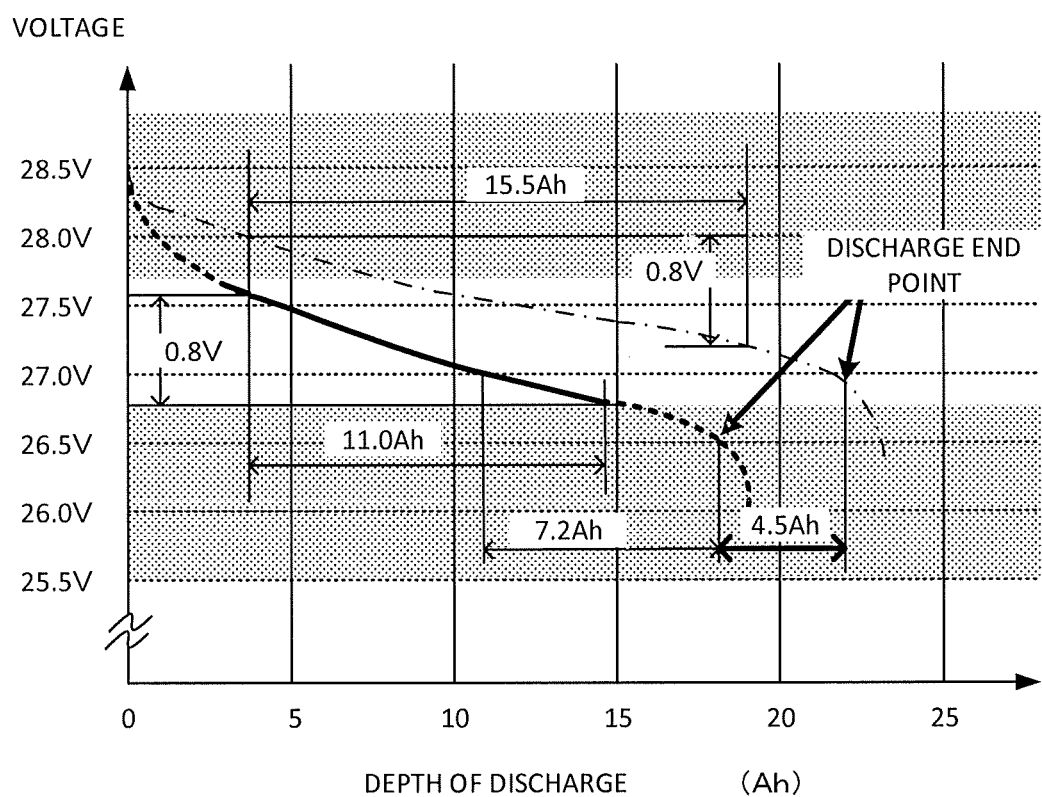
FIG. 7 is a diagram for describing the function creation unit according to the first embodiment of the invention.

Meanwhile, considering a use status of the battery by a user, a user starts a charging operation before the discharge end point in many cases. In addition, it is difficult to say that a user charges the battery 10 to the full charge state even in the charging operation. As a result, the data accumulated in the data accumulation unit 43 may not accumulate data of the overall range from the full charge state to the discharge end point. In FIGS. 5 and 7, the range where no data is accumulated is indicated by shading. In addition, in the depth-of-discharge characteristic curve of FIG. 7, a range where data is accumulated is indicated by a solid line, and a range where no data is accumulated is indicated by a dotted line. In addition, a depth-of-discharge characteristic curve at the time shipment is indicated by a one-dotted chain line. In general, the data is not accumulated in the vicinity of the discharge end point in many cases. As a result, an estimation error of the remaining capacity of the battery 10 increases disadvantageously.

The formula creation unit 44 has a supplementing functionality for creating the function by complementing the data even when the data is not accumulated in the vicinity of the discharge end point. The formula creation unit 44 has a function supplementing unit 441 that supplements the function representing the depth-of-discharge characteristic for the depth-of-discharge range having no accumulated data on the basis of a temporal degradation amount of the depth-of-discharge variation with respect to a variation of the output voltage of the battery 10. The function supplementation will be described in more details. In the example of FIG. 5, the unshaded range of an output voltage of 27.6 V to 26.8 V ($\Delta V=0.8$ V) is the range where no data is accumulated. In this range of ($\Delta V=0.8$ V), the depth-of-discharge variation is "14.5 Ah–3.5 Ah=11.0 Ah". Meanwhile, in the characteristic at the time of shipment, a depth-of-discharge variation of the output voltage range of 28.8 V to 27.2 V ($\Delta V=0.8$ V) is "19 Ah–3.5 Ah=15.5 Ah". That is, the depth-of-discharge variation within a range of the output voltage variation ($\Delta V=0.8$ V) is degraded by "15.5 Ah–11.0 Ah=4.5 Ah". In this regard, the formula creation unit 44 supplements the depth-of-discharge characteristic curve by shifting the discharge end point by 4.5 Ah. For example, the formula creation unit 44 adds a part of the depth-of-discharge characteristic curve at the time of shipment in the vicinity of the discharge end point to a right end of the curve created from the accumulated data and indicated by the solid line. In this case, the formula creation unit 44 supplements the depth-of-discharge characteristic curve by shifting the discharge end point indicated by the added curve to the left side by 4.5 Ah with respect to the discharge end point of the depth-of-discharge characteristic curve at the time of shipment.

Returning to FIG. 1, the remaining capacity calculation unit 50 calculates the remaining capacity of the battery 10 corresponding to the output voltage of the battery 10 using a function approximating the depth-of-discharge characteristic curve created by the function creation unit 40. For example, if the output voltage of the battery 10 is "27.0 V" in FIG. 7, the remaining capacity calculation unit 50 calculates the depth of discharge as "10.8 Ah". In addition, since the discharge end point is set to "18 Ah", the remaining capacity calculation unit 50 calculates the remaining capacity of the battery 10 for an output voltage of the battery 10 of 27.0 V as "7.2 Ah (18 Ah–10.8 Ah=7.2 Ah)".

The input unit 60 has an input key pad and a pointing device such as a touch panel. The input unit 60 notifies an input user instruction to the function creation unit 40.

The display unit 70 has a display device such as a liquid crystal display (LCD). The display unit 70 displays a processing result of the remaining capacity calculation unit 50 or the like.

Note that the function creation unit 40 and the remaining capacity calculation unit 50 of the remaining capacity estimation device 100 may physically include a computer having a central processing unit (CPU) or a memory unit. The functionalities of the function creation unit 40 and the remaining capacity calculation unit 50 may be implemented through software processing using the CPU.

Next, a remaining capacity estimation processing using the battery system 1 having the aforementioned configuration will be described with reference to FIG. 8. The power supply device 200 and the load device 300 are connected to the battery system 1. As a user performs an activation manipulation of the battery system 1 from the input unit 60, the remaining capacity estimation processing of FIG. 8 starts.

As the driving starts, the function creation unit 40 of the remaining capacity estimation device 100 obtains a depth-of-discharge variation for each $\Delta V$ (=0.1 V) on the basis of the depth-of-discharge characteristic curve of the battery 10 at the time of shipment stored in the data accumulation unit 43 (step S11). The function creation unit 40 stores the obtained variation in the columns of "AT THE TIME OF SHIPMENT" of the table of FIG. 4.

Then, the function creation unit 40 monitors the output voltage of the battery 10 obtained from the voltage measurement unit 30. In addition, the function creation unit 40 stores the depth-of-discharge variation whenever the output voltage of the battery 10 changes in the unit of $\Delta V$ (=0.1 V) set in the table (step S12). Specifically, the function creation unit 40 stores, as the depth-of-discharge variation, a total sum of the current charged or discharged while the output voltage of the battery 10 changes by 0.1 V in the corresponding rows of the "FIRST" column of the table of FIG. 4.

As the table of FIG. 4 is updated, the function creation unit 40 creates the table of FIG. 5 by collecting the data of the depth of discharge at the time of updating. In addition, the function creation unit 40 creates and updates the function representing the depth-of-discharge characteristic curve on the basis of the created table (step S13). For the range shaded in FIGS. 5 and 7 where no data is accumulated, the function creation unit 40 supplements data to create the function representing the depth-of-discharge characteristic.

Next, the function creation unit 40 determines whether or not a user requests to display the remaining capacity of the battery 10 (step S14). If a user does not request to display the remaining capacity (step S14: No), the function creation unit 40 repeats the processing of steps S12 to S14.

Meanwhile, if a user requests to display the remaining capacity from the input unit 60 (step S14: Yes), the function creation unit 40 measures the output voltage (step S15). In addition, the remaining capacity calculation unit 50 calculates the remaining capacity of the battery 10 by applying the measured output voltage to the function created in step S13, and causes the display unit 70 to display the remaining capacity (step S16). In the example indicated by the solid line in FIG. 7, if the measured output voltage is at "27.0 V", the remaining capacity calculation unit 50 causes the display unit 70 to display the remaining capacity as "7.2 Ah (18 Ah−10.8 Ah=7.2 Ah).

The remaining capacity calculation unit 50 causes the display unit 70 to display the full-charge-state dischargeable current capacity and the output voltage of the battery 10. In the example of FIG. 7, if the output voltage of the battery 10 is at "27.0 V", the remaining capacity calculation unit 50 causes the display unit 70 to display the full-charge-state dischargeable current capacity as "18 Ah" and the output voltage as "27.0 V". In addition, the remaining capacity calculation unit 50 causes the display unit 70 to display a state of charge (SoC) value. The SoC is calculated using the following formula. The full-charge-state dischargeable current capacity used in this case is not the value at the time of shipment, but is a value based on the latest function updated by the function creation unit 40.

$$SoC = \text{remaining capacity/full-charge-state dischargeable current capacity} \quad \text{(Formula 1)}$$

Next, the function creation unit 40 determines whether or not the full-charge-state dischargeable current capacity decreases under a preset threshold value (step S17). If the full-charge-state dischargeable current capacity is smaller than the preset threshold value (step S17: Yes), the function creation unit 40 causes the display unit 70 to display an alarm for urging replacement of the battery (step S18). If the full-charge-state dischargeable current capacity is equal to or larger than the preset threshold value (step S17: No), the function creation unit 40 returns the processing to step S12, and continuously repeats the processing of steps S12 to S18.

As described above, the battery system 1 according to this embodiment has the function creation unit 40 that frequently updates and creates the function representing the depth-of-discharge characteristic of the battery 10 on the basis of the charged/discharged current caused by the charge/discharge operation of the battery 10 and the output voltage of the battery 10. In addition, the battery system 1 estimates the remaining capacity of the battery 10 on the basis of the updated function. As a result, the battery system 1 can estimate the remaining capacity of the battery 10 with high accuracy even when the depth-of-discharge characteristic of the battery 10 changes depending on temporal degradation of the battery 10. In addition, the battery system 1 measures the depth-of-discharge characteristic of the battery 10 while the battery 10 is connected to the load device 300. Therefore, it is not necessary to remove the battery 10 from the load device 300 and stop the load device 300. Furthermore, it is not necessary to prepare a dedicated measurement device for measuring the depth-of-discharge characteristic.

The formula creation unit 44 supplements the function representing the depth-of-discharge characteristic for the range where no data is accumulated on the basis of a temporal degradation amount of the depth-of-discharge variation with respect to the variation of the output voltage of the battery 10. As a result, the battery system 1 can accurately estimate the remaining capacity of the battery 10 even when there is no data in the vicinity of the discharge end point.

Note that, in the aforementioned description, a supplementing method by shifting the discharge end point as much as a degradation of the depth-of-discharge variation with respect to the output change of the battery 10 has been described as a method of supplementing the function using the formula creation unit 44. However, the supplementing method is not limited thereto. For example, the discharge end point may be supplemented on the basis of a degradation rate of the depth-of-discharge variation. For example, in a case where the depth-of-discharge variation at the time of shipment for a change of the output voltage of battery 10 of 0.8 V is "15.5 Ah", the depth-of-discharge variation after temporal degradation is "11.0 Ah", and the discharge end point at the time of shipment is "22 Ah", the function may be supplemented such that the supplemented discharge end point becomes "15.6 Ah (=22 Ah×11.0 Ah/15.5 Ah)".

In the aforementioned description, a case where the update data is stored in the data accumulation unit 43 whenever the output voltage of the battery 10 changes by $\Delta V$ (=0.1 V) has been described. However, the value of $\Delta V$ to be set may be arbitrarily set. By reducing "$\Delta V$", it is possible to more accurately create the function representing the depth-of-discharge characteristic.

In the aforementioned description, the discharge end point is defined as a slope $\theta$ of the depth-of-discharge characteristic curve. However, the definition of the discharge end point is not limited thereto. For example, the discharge end point may be defined as the output voltage of the battery 10. Specifically, a minimum voltage necessary to operate the load device 300 may be set as a voltage defining the discharge end point.

In the aforementioned description, the formula creation unit 44 obtains the discharge end point and obtains the current depth of discharge by applying the output voltage of the battery 10 to the function created by the formula creation unit 44, and calculates the remaining capacity by subtracting the current depth of discharge from the depth of discharge of the discharge end point. However, in a case where the discharge end point is defined as the output voltage of the battery 10, the depth of discharge and the remaining capacity may be obtained using the table of FIG. 5. Specifically, the current variation measurement unit 42 creates the table of FIG. 5 regarding the depth of discharge corresponding to the output voltage of the battery 10. In addition, the remaining capacity calculation unit 50 obtains the depth of discharge at the time of updating corresponding to the output voltage using the table of FIG. 5. For example, if the output voltage is at "27.0 V", the depth of discharge is "10.8 Ah" with reference to the table of FIG. 5. For example, assuming that the output voltage of the discharge end point is set to "26.8 V", the depth of discharge corresponding to an output voltage of 26.8 V is "14.5 Ah" in the table of FIG. 5. In this case, the remaining capacity calculation unit 50 calculates the remaining capacity of corresponding to the output voltage of 27.0 V as "3.7 Ah (14.5 Ah−10.8 Ah=3.7 Ah)" in the table of FIG. 5. In this case, the formula creation unit 44 can obtain the remaining capacity just by looking up the table without necessity of creating the function representing the depth-of-discharge characteristic. Therefore, it is possible to simplify the calculation processing.

In the aforementioned description, a case where the function representing the depth-of-discharge characteristic is updated whenever a new depth-of-discharge variation is stored has been described with reference to the flowchart of FIG. 8. However, the timing for updating the function for approximating the depth of discharge is not limited thereto. For example, the function may be updated on a preset period basis such as on a monthly basis or on a yearly basis. In addition, the function may be updated whenever a preset charging count is achieved.

Figure 8:
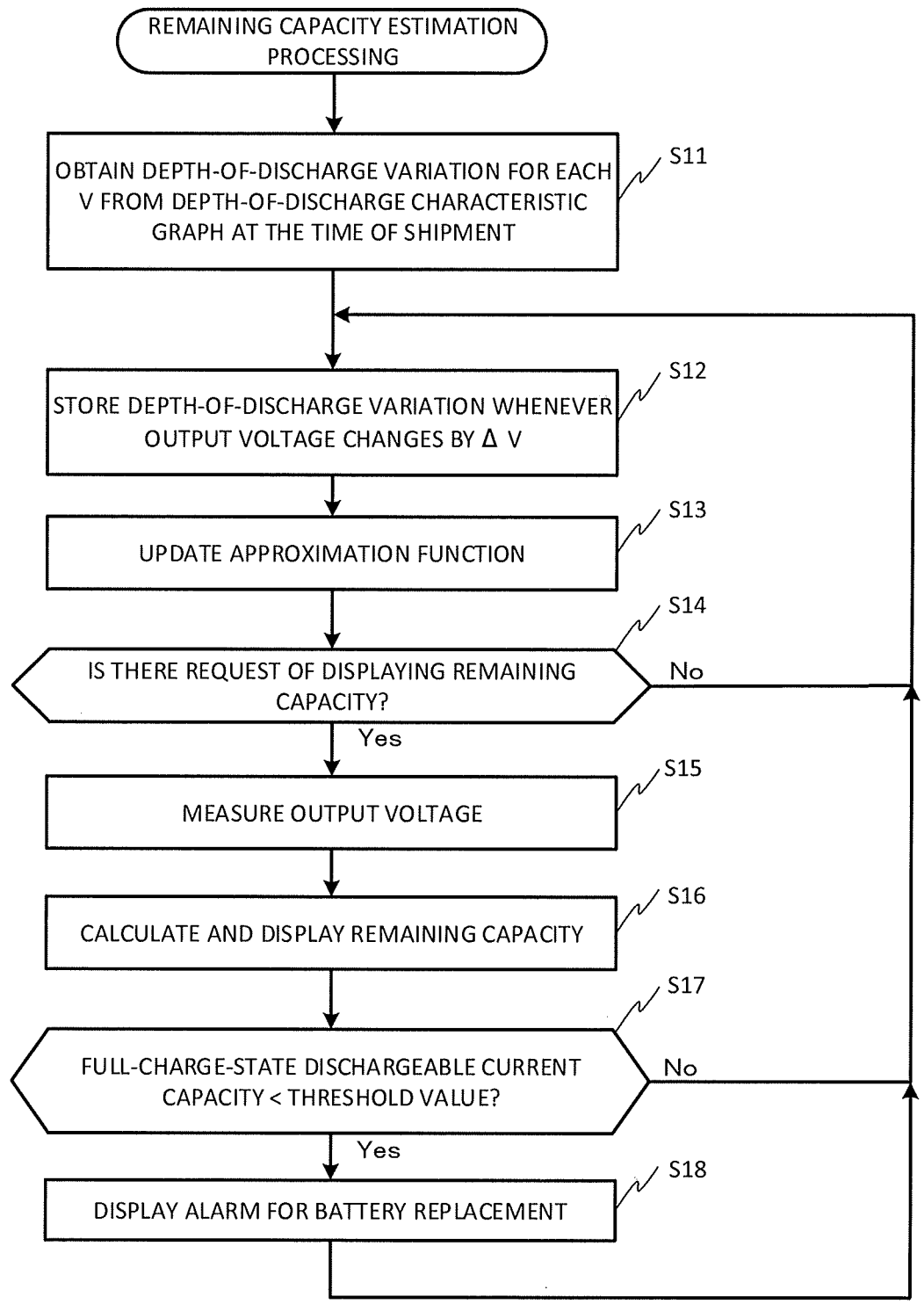
FIG. 8 is a flowchart for describing operations of the battery system according to the first embodiment of the invention.

The flowchart of FIG. 8 is just for an illustrative purpose, and does not limit the processing method. For example, step S11 of FIG. 8 may be omitted, and the depth-of-discharge variation at the time of shipment may be stored in the data accumulation unit 43 in advance. In addition, the processing of steps S11 to S13 and the processing of steps S14 to S18 may be performed independently. Specifically, the processing of steps S11 to S13 is continuously performed as a routine processing. In addition, the display request from a user in step S14 may be set as an interrupt processing, so that the processing of steps S15 to S18 is performed when there is a display request from a user.

Second Embodiment

Next, the second embodiment of the invention will be described with reference to the accompanying drawings. Like reference numerals denote like elements as in the first embodiment, and they will not be described repeatedly, or will be described in brief. A battery system 1b according to the second embodiment is different from the battery system 1 of the first embodiment in the method of obtaining the depth-of-discharge characteristic curve. Specifically, a configuration of the function creation unit 40b of the remaining capacity estimation device 100b is different from that of the function creation unit 40 of the remaining capacity estimation device 100 of the first embodiment.

Figure 9:
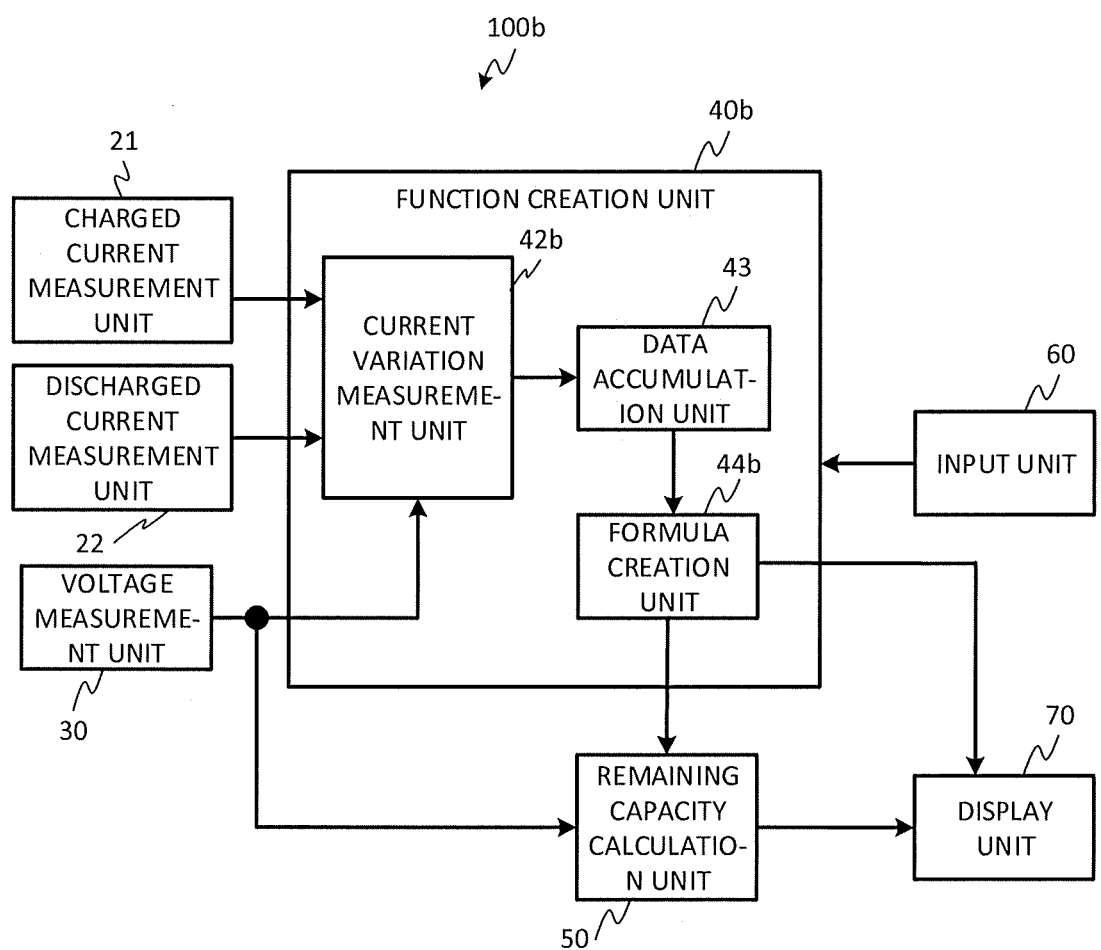
FIG. 9 is a block diagram illustrating a function creation unit according to a second embodiment of the invention.

FIG. 9 is block diagram illustrating the function creation unit 40b according to the second embodiment. As illustrated in FIG. 9, the function creation unit 40b has a current variation measurement unit 42b, a data accumulation unit 43, and a formula creation unit 44b.

The current variation measurement unit 42b calculates the depth of discharge of the battery 10 on the basis of the current charged to or discharged from the battery 10. This will be described below in more details. It is assumed that the data representing the depth-of-discharge characteristic of the battery 10 at the time of shipment is stored in the data accumulation unit 43 in advance. The current variation measurement unit 42b calculates a total sum of the charged current or a total sum of the discharged current for a period from the charging start to the charging end of the battery 10, a period from the charging end to the next charging stat, or a preset period (such as one minute, ten minutes, or one hour). In the current variation measurement unit 42b adds or subtracts the total sum of the charged/discharged current (depth-of-discharge variation) from or to the depth of discharge (for example, 0 Ah) at the time of shipment stored in the data accumulation unit 43 to calculate the depth of discharge of the battery 10 at the time of measurement. If a period from the next charging start to the charging end, a period from the charging end to the next charging start, or a preset period elapses, the current variation measurement unit 42b calculates a total sum of the charged current or a total sum of the discharged current for that period. The current variation measurement unit 42b adds or subtracts the calculated total sum of the charged/discharged current to or from the previously calculated depth of discharge of the battery 10 to calculate the depth of discharge of the battery 10 at the current time. Similarly, the current variation measurement unit 42b continuously calculates the depth of discharge of the battery 10.

The current variation measurement unit 42b accumulates the data in which the calculated depth of discharge and the output voltage of the battery 10 are associated with each other in the data accumulation unit 43. Specifically, the current variation measurement unit 42b accumulates, in the data accumulation unit 43, the associated data such as (depth of discharge, output voltage) for each period from the charging start to the charging end of the battery 10, each period from the charging end to the next charging start, or each preset period (such as one minute, ten minutes, or one hour).

The formula creation unit 44b creates a function representing the depth-of-discharge characteristic of the battery 10 on the basis of the accumulated data. The formula creation unit 44b updates the function representing the depth-of-discharge characteristic of the battery 10 for each preset period (for example, one month) or a preset charging count (for example, one hundred counts). The creation of the function will be described below in more details.

The remaining capacity calculation unit 50 is similar to that of the first embodiment.

Figure 10:
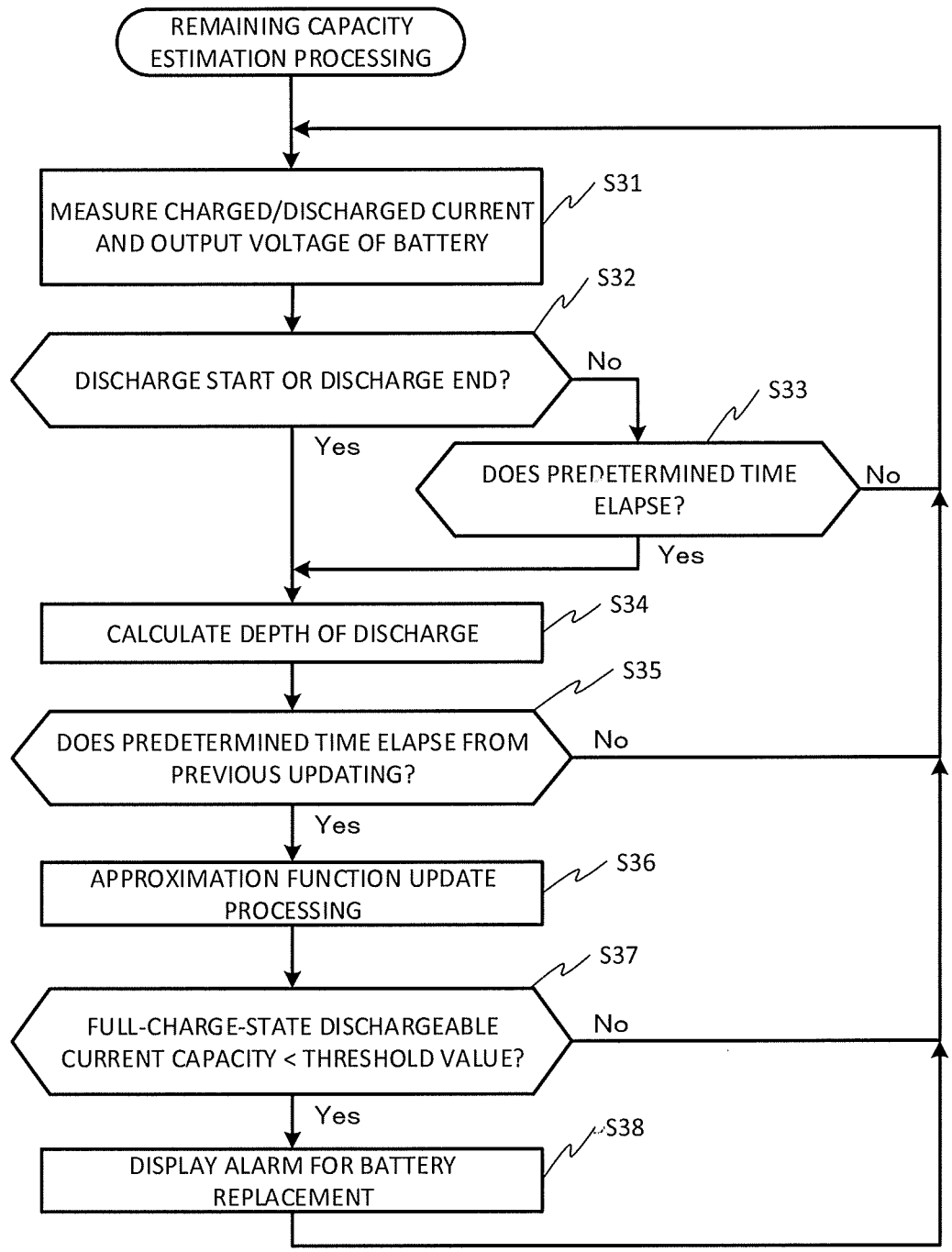
FIG. 10 is a flowchart for describing operations of the battery system according to the second embodiment of the invention.

Next, the remaining capacity estimation processing using the battery system 1b having the aforementioned configuration will be described with reference to FIG. 10. The power supply device 200 and the load device 300 are connected to the battery system 1b. The remaining capacity estimation processing of FIG. 10 starts as a user performs an activation manipulation for the battery system 1b using the input unit 60.

As the operation starts, the battery system 1b sequentially measures the charged/discharged current of the battery 10 and the output voltage of the battery 10 (step S31). The function creation unit 40b detects a timing for starting charging or a timing for terminating charging from the power supply device 200 (step S32). The function creation unit 40b detects this timing on the basis of a change of the current measured by the charged current measurement unit 21. The function creation unit 40b may detect this timing on the basis of a notification signal from the power supply device 200.

Figure 11:
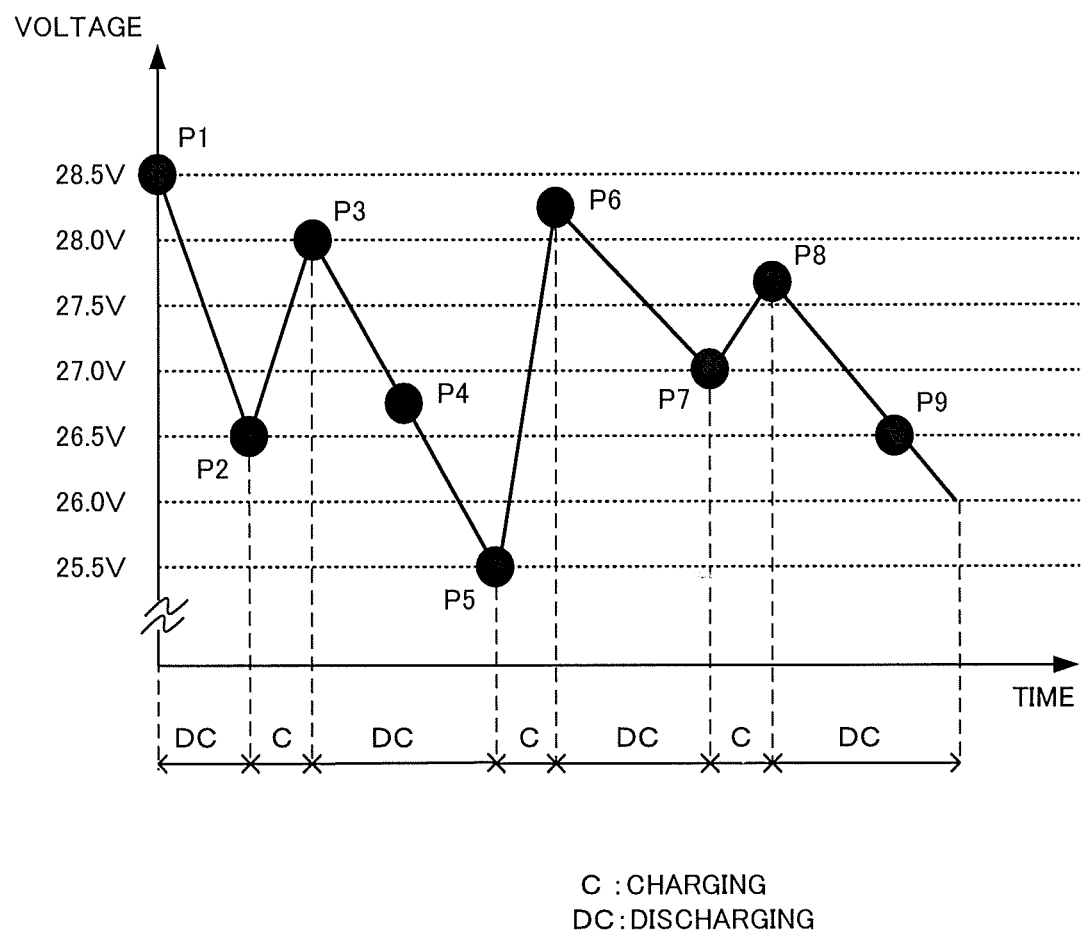
FIG. 11 is a diagram for describing an output voltage change caused by a battery charge/discharge operation.

It is assumed that the battery 10 is charged and discharged as illustrated in FIG. 11 by way of example. The current is discharged from the battery 10 to the load device 300 for a period from the timing P1 at which a driving operation of the battery system 1b starts to the timing P2. The current is charged from the power supply device 200 to the battery 10 for the timings P2 to P3. The current is discharged from the battery 10 to the load device 300 for the timings P3 to P5. The current is charged from the power supply device 200 to the battery 10 for the timings P5 to P6. This similarly applies to the following description.

The current variation measurement unit 42b of the function creation unit 40b detects a start of the charging from the power supply device 200 at the timings P2, P5, and P7. In addition, the current variation measurement unit 42b detects termination of the charging at the timings P3, P6, and P8.

If it is not the timing for starting the charging operation from the power supply device 200, or the timing for terminating the charging (step S32: No), the function creation unit 40b detects whether or not a predetermined time elapses after the previous depth of discharge of the battery 10 is calculated (step S33). The predetermined time refers to a preset time such as one minute, ten minutes, or one hour. If a predetermined time does not elapse (step S33: No), the function creation unit 40b repeats the processing of steps S31 to S33. If the predetermined time elapses (step S33: Yes), the function creation unit 40b advances the processing to step S34.

Meanwhile, if the timing for starting the charging from the power supply device 200 or the timing for terminating the charging is detected (step S32: Yes), the function creation unit 40b calculates the depth of discharge of the battery 10 (step S34). The function creation unit 40b also performs the processing of step S34 if it is detected that a predetermined time elapses (step S33: Yes) after the previous depth of discharge of the battery 10 is calculated. The timings P4 and P9 of FIG. 11 correspond to the timing after the predetermined time elapses. If a period of time until the charging starts is long, the function creation unit 40b acquires data at each predetermined time in order to supplement the data.

Next, a method of calculating the depth of discharge of the battery 10 will be described. The current variation measurement unit 42b calculates a total sum of the current (depth-of-discharge variation) discharged for a period from the timing P1 to the timing P2 of FIG. 11. In addition, the current variation measurement unit 42b adds the depth-of-discharge variation for the timings P1 to P2 to the depth of discharge (0 Ah) of the battery 10 at the time of shipment to calculate the depth of discharge of the battery 10 at the timing P2. In addition, the current variation measurement unit 42b calculates a total sum of the current charged for the timings P2 to P3 of FIG. 11. Furthermore, the current variation measurement unit 42b subtracts a total sum of the current charged for the timings P2 to P3 from the depth of discharge of the battery 10 at the timing P2 to calculate the depth of discharge of the battery 10 at the timing P3. Similarly, the current variation measurement unit 42b calculates the depth of discharge of the battery 10 for the timings P4 to P9.

The current variation measurement unit 42b stores, in the data accumulation unit 43, the data (depth of discharge, output voltage) obtained by associating the depth of discharge of the battery 10 for the timings P1 to P9 and the output voltage of the battery 10 for each timing.

Then, the formula creation unit 44b determines whether or not a predetermined time elapses after the function representing the depth-of-discharge characteristic of the battery 10 is updated previously (step S35). The predetermined time is set to, for example, one month. If it is determined that the predetermined time does not elapse (step S35: No), the function creation unit 40b repeats the processing of steps S31 to S35.

Figure 12:
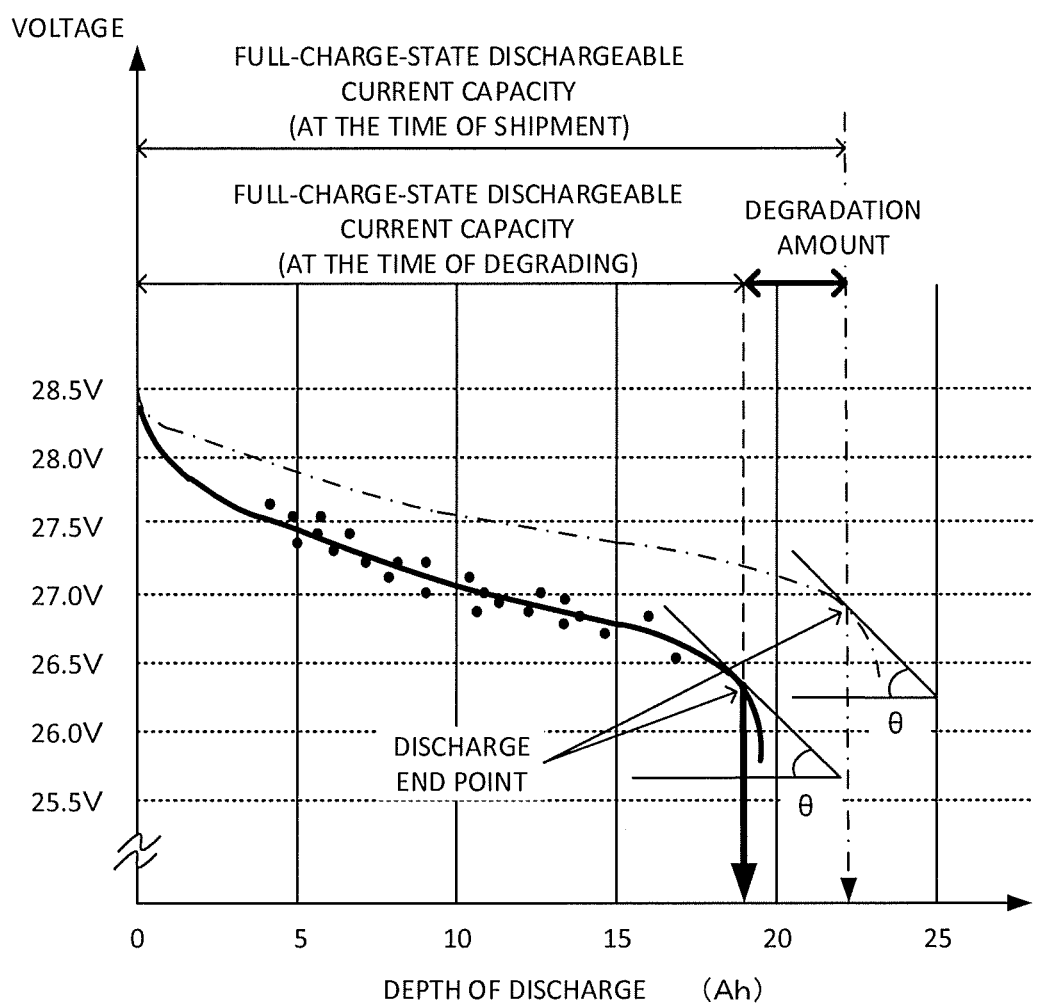
FIG. 12 is a diagram for describing the function creation unit according to the second embodiment of the invention.

Otherwise, if it is determined that the predetermined time elapses (step S35: Yes), the formula creation unit 44b updates the function representing the depth-of-discharge characteristic (step S36). Specifically, the formula creation unit 44b plots the accumulated data (depth of discharge, output voltage) in a graph having an abscissa set as the depth of discharge of the battery 10 and an ordinate set as the output voltage of the battery 10 as illustrated in FIG. 12. In addition, the formula creation unit 44b creates the function representing the depth-of-discharge characteristic of the battery 10 by statistically processing the plotted data.

For example, assuming that the function F0 representing the depth-of-discharge characteristic of the battery 10 at the time of shipment is expressed as a fifth order function as shown in Formula 2, the values $a_5$ to $a_0$ are integers obtained to express the depth-of-discharge characteristic of the battery 10 at the time of shipment in the function F0. The formula creation unit 44b creates the function F1 of Formula 3 on the basis of the data plotted using Formula 2. The values $b_5$ to $b_0$ are integers obtained to express the depth-of-discharge characteristic of the battery 10 at the time of creating the function using the function F1. The formula creation unit 44b obtains such integers, for example, on the basis of the least squares method.

$$F0 = a_5 X^5 + a_4 X^4 + a_3 X^3 + a_2 X^2 + a_1 X + a_0 \quad \text{(Formula 2)}$$

$$F1 = b_5 X^5 + b_4 X^4 + b_3 X^3 + b_2 X^2 + b_1 X + b_0 \quad \text{(Formula 3)}$$

The formula creation unit 44b creates and updates the function representing the depth-of-discharge characteristic of the battery 10 at that time whenever a predetermined period of time (such as one month) elapses. For example, assuming that the function F0 representing the depth-of-discharge characteristic at the time of shipment is plotted as the one-dotted chain line in the graph of FIG. 12, most of the data (depth of discharge, output voltage) accumulated immediately after shipment are plotted on the line of the function F0. However, the data (depth of discharge, output voltage) accumulated for one month as the battery 10 is subjected to temporal degradation are increasingly plotted far over the line of function F0 in many cases. In addition, a difference from the function F0 also increases. As a result, as the time elapses after shipment, a difference between the function F1 created by the formula creation unit 44b and the function F0 at the time of shipment increases.

Then, the formula creation unit 44b determines whether or not the full-charge-state dischargeable current amount indicated by the updated function representing the depth-of-discharge characteristic of the battery 10 is equal to or smaller than a preset threshold value (step S37).

As illustrated in FIG. 12, the full-charge-state dischargeable current capacity decreases as the battery 10 is subjected to temporal degradation. If the full-charge-state dischargeable current capacity is smaller than the preset threshold value (step S37: Yes), the formula creation unit 44b causes the display unit 70 to display an alarm for urging replacement of the battery (step S38). If the full-charge-state dischargeable current capacity is equal to or larger than the preset threshold value (step S37: No), the function creation unit 40b returns the processing to step S31 and continuously repeats the processing of steps S31 to S37.

As described above, the formula creation unit 44b of the battery system 1b according to the second embodiment obtains the function representing the depth-of-discharge characteristic after the battery 10 is subjected to temporal degradation by statistically processing the accumulated data (depth of discharge, output voltage). As a result, the battery system 1b can estimate the remaining capacity of the battery 10 with high accuracy even when the depth-of-discharge characteristic of the battery 10 changes depending on temporal degradation.

In the first and second embodiments, the battery systems 1 and 1b measure the output voltage of the battery 10 during discharging to the load device 300. Since an internal resistance of the battery 10 or a wiring resistance of the apparatus generates a voltage drop, a difference may occur in the measurement value of the output voltage of the battery 10 depending on the magnitude of the discharged current even when the current amount accumulated in the battery 10 is the same. Since the battery system 1b according to the second embodiment creates the function representing the depth-of-discharge characteristic by statistically processing the measured data, it is possible to prevent such an error caused by such a measurement deviation.

Note that, in the aforementioned description, a case where the data are accumulated in the data accumulation unit 43 at the time of a charging start or a charging end and when a predetermined time elapses has been described. However, the timing for accumulating the data is not limited thereto. For example, the data may be accumulated only at the charging start or the charging end. In addition, as described in the first embodiment, the output voltage of the battery 10 may be monitored, and the data may be accumulated as the output voltage changes by $\Delta V$ (=0.1 V) as a trigger.

In a case where the period for updating the function representing the depth-of-discharge characteristic using the formula creation unit 44b is long, such as one year, the function representing the depth-of-discharge characteristic is preferably created, for example, on the basis of the data for immediately previous one month.

In the aforementioned description, it is assumed that the surrounding temperature is constant. In a case where the surrounding temperature changes, the battery system 1 has a temperature sensor (not shown). The current variation measurement unit 42 creates a table representing the depth of discharge corresponding to the output voltage of the battery 10 for each designated temperature range. The current variation measurement unit 42 creates a table for each data measured for the designated temperature range such as a temperature range of 10° C. to 15° C. or a temperature of 15° C. to 20° C. The function creation unit 40 creates the table of FIG. 5 by collecting the data at the time of updating of the depth of discharge for each designated temperature range.

«First Modification»

Figure 13:
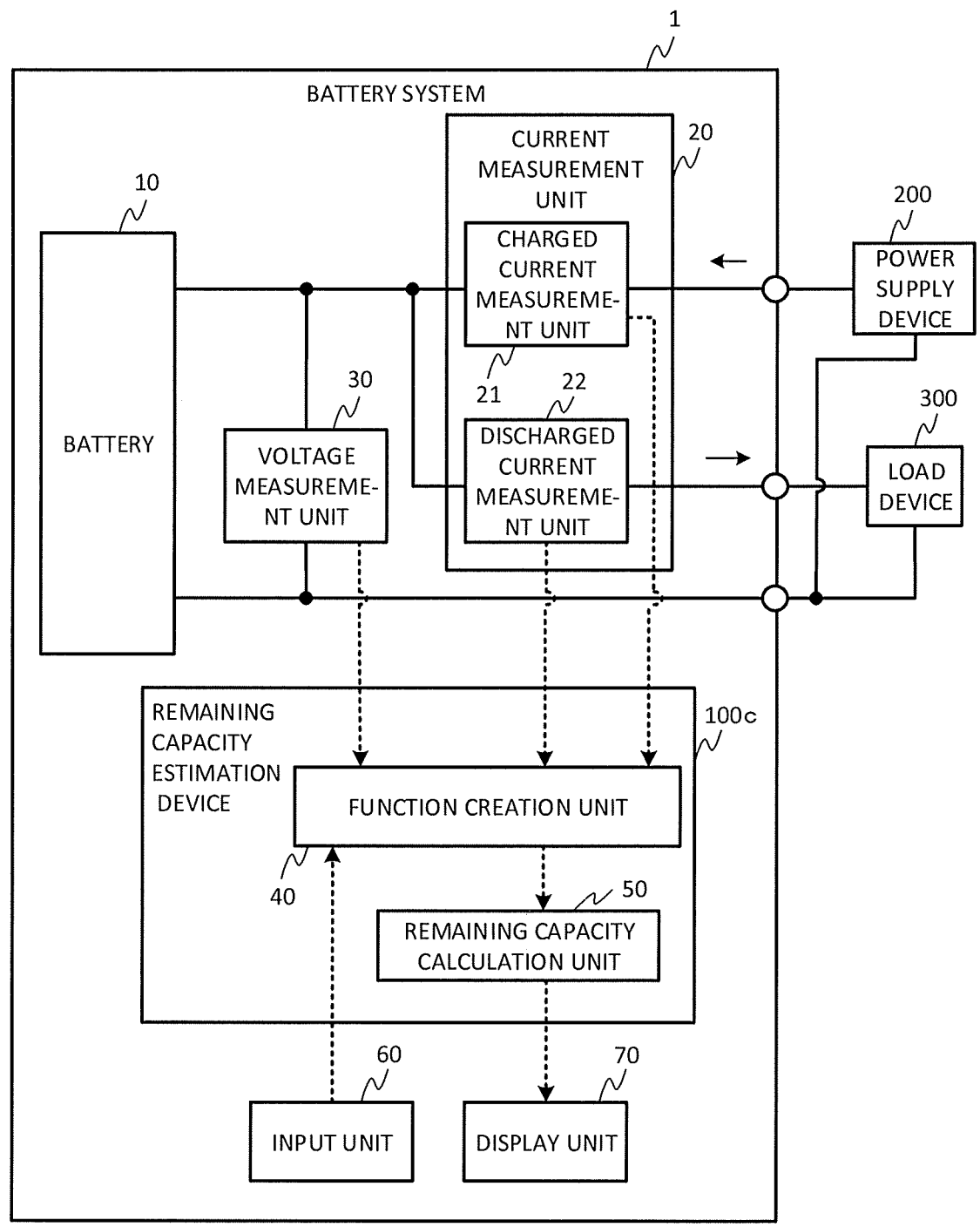
FIG. 13 is a block diagram illustrating a battery system according to a first modification of the invention.

In the description of the first embodiment, the remaining capacity estimation device 100 has the current measurement unit 20 and the voltage measurement unit 30 as illustrated in FIG. 1. Alternatively, as illustrated in FIG. 13, the current measurement unit 20 and the voltage measurement unit 30 may be connected as an external device of the remaining capacity estimation device 100c.

«Second Modification»

Figure 14:
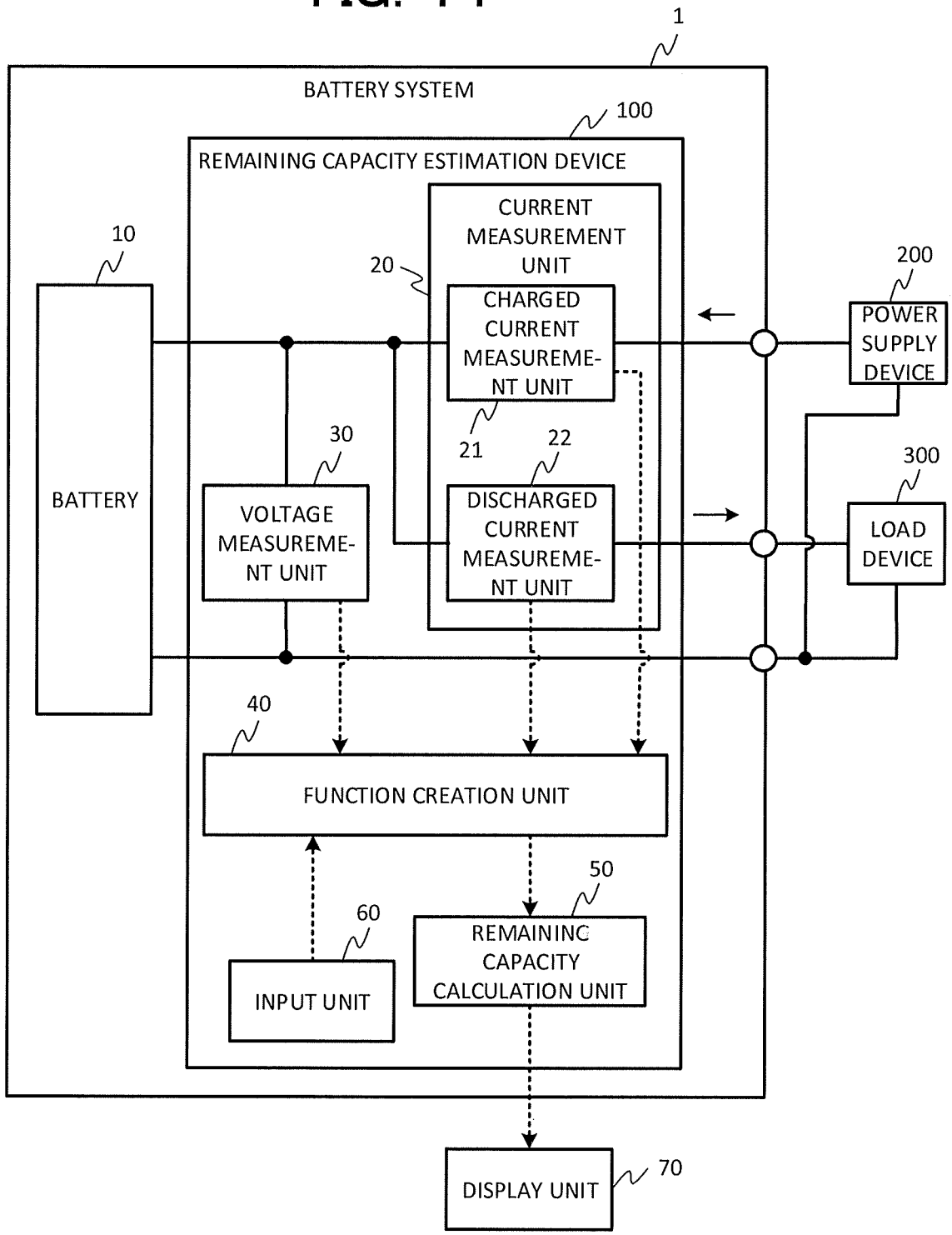
FIG. 14 is a block diagram illustrating a battery system according to a second modification of the invention.

As illustrated in FIG. 14, in the battery system 1 according to the second modification, the display unit 70 is connected as an external device of the remaining capacity estimation device 100. Alternatively, the input unit 60 may be connected as an external device of the remaining capacity estimation device 100 as the other modification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A battery system comprising:
a battery;
a current measurement unit configured to measure a current charged to or discharged from the battery;
a voltage measurement unit configured to measure an output voltage of the battery;
a function creation unit configured to create a function representing a depth-of-discharge characteristic of the battery on the basis of the measured current and output voltage, and further including
a current variation measurement unit configured to calculate a depth of discharge of the battery on the basis of the current charged to or discharged from the battery and the output voltage of the battery;
a data accumulation unit configured to accumulate data created by associating the output voltage of the battery and the depth of discharge corresponding to the output voltage of the battery; and
a formula creation unit configured to create the function representing the depth-of-discharge characteristic of the battery on the basis of the accumulated data, and further including
a function supplementing unit configured to supplement the function representing the depth-of-discharge characteristic in a vicinity of a discharge endpoint where the data is not accumulated, by adding a part of a predetermined depth-of-discharge characteristic function in the vicinity of the discharge end point to the function created from the accumulated data; and
a remaining capacity calculation unit configured to calculate a remaining capacity corresponding to the output voltage of the battery using the created function.

2. The battery system according to claim 1, wherein the function creation unit updates the function representing the depth-of-discharge characteristic of the battery for each preset period of time or for each preset charging count.

3. The battery system according to claim 1, wherein the function creation unit causes a display unit to display an alarm for urging replacement of the battery if a full-charge-state dischargeable current capacity of the battery indicated by the created function is equal to or lower than a threshold value.

4. A remaining capacity estimation device for estimating a remaining capacity of a battery, comprising:
a function creation unit configured to create a function representing a depth-of-discharge characteristic of the battery on the basis of a current charged to or discharged from the battery and an output voltage of the battery, and further including
  a current variation measurement unit configured to calculate a depth of discharge of the battery on the basis of the current charged to or discharged from the battery and the output voltage of the battery;
  a data accumulation unit configured to accumulate data created by associating the output voltage of the battery and the depth of discharge corresponding to the output voltage of the battery, and
  a formula creation unit configured to create the function representing the depth-of-discharge characteristic of the battery on the basis of the accumulated data, and further including
    a function supplementing unit configured to supplement the function representing the depth-of-discharge characteristic in a vicinity of a discharge endpoint where the data is not accumulated, by adding a part of a predetermined depth-of-discharge characteristic function in the vicinity of the discharge end point to the function created from the accumulated data, and
  a remaining capacity calculation unit configured to calculate a remaining capacity corresponding to the output voltage of the battery using the created function.

5. A remaining capacity estimation device for estimating a remaining capacity of a battery, comprising:
  a function creation unit configured to create a table regarding a depth of discharge corresponding to an output voltage of the battery on the basis of a current charged to or discharged from the battery and the output voltage of the battery, and further including
  a current variation measurement unit configured to calculate a depth of discharge of the battery on the basis of the current charged to or discharged from the battery and the output voltage of the battery;
  a data accumulation unit configured to accumulate data created by associating the output voltage of the battery and the depth of discharge corresponding to the output voltage of the battery; and
  a formula creation unit configured to create the function representing the depth-of-discharge characteristic of the battery on the basis of the accumulated data, and further including
    a function supplementing unit configured to supplement the function representing the depth-of-discharge characteristic in a vicinity of a discharge endpoint where the data is not accumulated, by adding a part of a predetermined depth-of-discharge characteristic function in the vicinity of the discharge end point to the function created from the accumulated data; and
  a remaining capacity calculation unit configured to calculate a remaining capacity corresponding to the output voltage of the battery using the created table.

6. A remaining capacity estimation method for estimating a remaining capacity of a battery, comprising:
  measuring a current charged to or discharged from the battery;
  measuring an output voltage of the battery;
  creating an index representing a depth-of-discharge characteristic of the battery on the basis of the measured current and output voltage, and further including
    calculating a depth of discharge of the battery on the basis of the current charged to or discharged from the battery and the output voltage of the battery;
    accumulating data created by associating the output voltage of the battery and the depth of discharge corresponding to the output voltage of the battery; and
    creating the function representing the depth-of-discharge characteristic of the battery on the basis of the accumulated data, and
    supplementing the function representing the depth-of-discharge characteristic in a vicinity of a discharge endpoint where the data is not accumulated, by adding a part of a predetermined depth-of-discharge characteristic function in the vicinity of the discharge end point to the function created from the accumulated data; and
  calculating a remaining capacity corresponding to the output voltage of the battery using the created function.

7. The remaining capacity estimation method according to claim 6, wherein a function indicating the depth-of-discharge characteristic of the battery is created as the index in creating the index.

8. The remaining capacity estimation method according to claim 7, wherein a table of a depth of discharge corresponding to the output voltage of the battery is created as the index in creating the index.

9. The remaining capacity estimation method according to claim 8, wherein
  in measuring the current and measuring the output voltage, the ambient temperature is measured,
  in creating the index, the table of the depth of discharge is created for each specified temperature range, and
  in calculating the remaining capacity, the remaining capacity corresponding to the output voltage of the battery is calculated using the table created for each specified temperature range.

* * * * *